United States Patent [19]

Mellet

[11] Patent Number: 4,704,988

[45] Date of Patent: Nov. 10, 1987

[54] PROCESS AND APPARATUS FOR OBTAINING A GASEOUS STREAM CONTAINING A COMPOUND IN THE VAPOR STATE, MORE PARTICULARLY USABLE FOR INTRODUCING THIS COMPOUND INTO AN EPITAXY REACTOR

[76] Inventor: Robert Mellet, 18 Rue Chapon, 75003 Paris, France

[21] Appl. No.: 762,707

[22] Filed: Aug. 5, 1985

[30] Foreign Application Priority Data

Aug. 14, 1984 [FR] France .................. 84 12788

[51] Int. Cl.$^4$ ............................... C23C 16/00
[52] U.S. Cl. .................. 118/726; 118/715; 219/274; 261/122; 261/123; 261/104; 261/DIG. 65
[58] Field of Search ............... 118/715, 726; 219/274; 261/122, 123, 104, DIG. 65

[56] References Cited

U.S. PATENT DOCUMENTS 3,459,668 8/1969 Schmit .................. 252/62.3

FOREIGN PATENT DOCUMENTS 1559978 1/1980 United Kingdom.

OTHER PUBLICATIONS

Powell et al., Vapor Deposition, John Wiley and Sons, New York, ©1966, pp. 269–274.

Primary Examiner—Richard Bueker
Attorney, Agent, or Firm—Pearne, Gordon, McCoy & Granger

[57] ABSTRACT

The invention relates to a process and an apparatus for obtaining a gaseous stream containing a compound in the vapor state, more particularly usable for introducing said compound into a vapor phase epitaxy reactor.

The process consists of introducing the compound into the first compartment of an enclosure subdivided into first and second compartments by a porous partition, raising to a given temperature the first compound of the enclosure so as to evaporate the compound, circulating within the second compartment a carrier gas able to entrain the evaporated compound and extracting from the second compartment the carrier gas containing the evaporated compound which has diffused into the second compartment by passing through the porous partition.

By regulating the temperature, it is possible to control the flowrate of the compound diffused through the partition and by regulating the flowrate of the carrier gas in the second compartment, it is possible to regulate to the desired value the partial pressure of the compound in the gaseous stream leaving the enclosure by the pipe.

10 Claims, 2 Drawing Figures

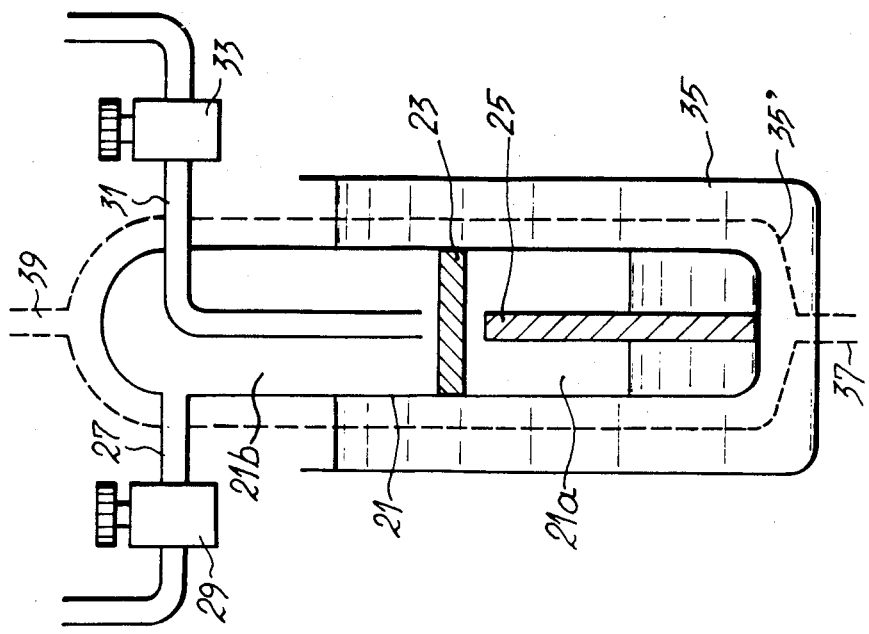
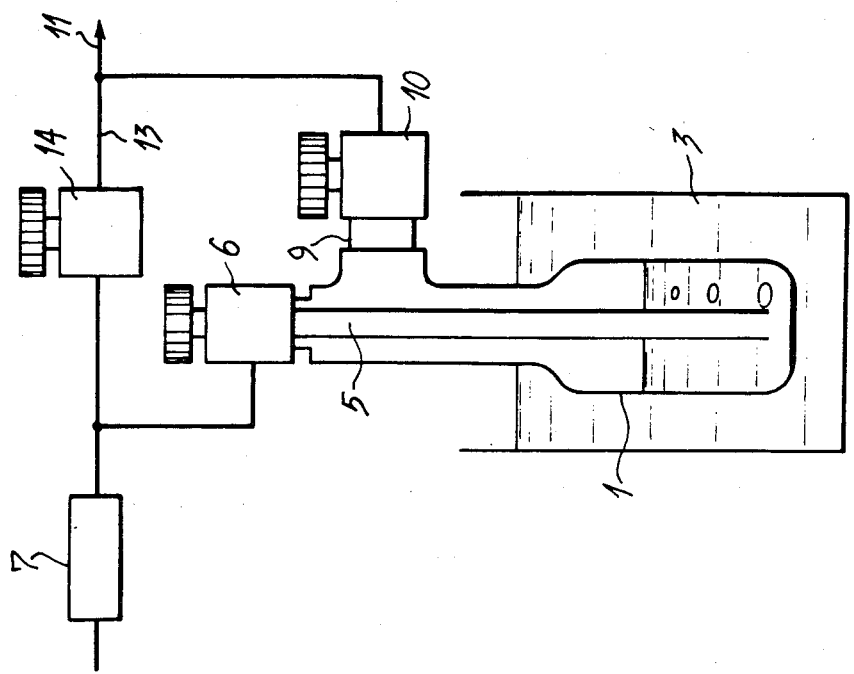

PROCESS AND APPARATUS FOR OBTAINING A GASEOUS STREAM CONTAINING A COMPOUND IN THE VAPOR STATE, MORE PARTICULARLY USABLE FOR INTRODUCING THIS COMPOUND INTO AN EPITAXY REACTOR

BACKGROUND OF THE INVENTION

The present invention relates to a process and to an apparatus for obtaining a gaseous stream containing a compound in the vapour state, more particularly usable for introducing said compound in to a vapour phase epitaxy reactor.

Vapour phase epitaxy methods are generally used for producing semiconductors and particularly those of the III-V or II-VI types.

This method can in particular be used for forming heterojunctions constituted by several layers of semiconductors having different compositions, which have numerous applications, e.g. in optoelectronics (lasers, photodetectors) and in microelectronics (highspeed transistors).

For the vapour phase epitaxy deposition of composite semiconductor layers, the cationic constituents of the layer are generally introduced into an epitaxy enclosure in the form of vapours of their organometallic compounds.

Thus, in the case of semiconductors of the III-V type, such as gallium arsenide GaAs or indium phosphide InP, the growth rate of the semiconductor compound deposited by vapour phase epitaxy firstly depends on the partial pressure of the organometallic compounds containing the cationic constituents (Ga, In) at the epitaxy cell intake.

In the case of semiconductor compounds such as $Ga_{1-x}In_xAs_yP_{1-y}$, the cationic composition x in the solid phase is also directly dependent on the ratio of the partial pressures of the corresponding organometallic compounds in accordance with the following simple relation:

$$\frac{x}{1-x} = K \frac{pGa}{pIn}$$

in which pGa and pIn are respectively the partial pressures of the organometallic compounds containing the gallium and the indium, whilst K is a constant which is relatively insensitive to the other parameters of the process, such as the substrate temperature or the total gaseous flowrate.

However, in the process of growing alloys of type $Ga_{1-x}In_xAs_yP_{1-y}$, it is vital to control the composition x within very narrow limits. Thus, a variation of approximately 1% is prohibitive, because it leads to a crystal mesh parameter variation $\Delta a/a$ of approximately $10^{-3}$, which is generally sufficient to bring about an irreparable deterioration to the electronic properties of the material.

Moreover, in processes of this type, it is very important to be able to accurately control the partial pressures of the organometallic compounds introduced into the epitaxy reactor.

Hitherto, the conventional procedure for introducing these organometallic compounds into the epitaxy reactor has consisted of bubbling an inert carrier gas into the compound in the liquid state, so as to charge the carrier or vector gas in the vicinity of the vapour saturation of said compound. The saturated carrier gas is then diluted, in order to obtain the desired partial pressure.

An apparatus making it possible to obtain in this way a gaseous stream containing an organometallic compound in the vapour state is illustrated in FIG. 1. This apparatus comprises a tight enclosure 1 containing the organometallic compound in the liquid state, which can be raised to the desired temperature by a thermostatically controlled bath 3. A pipe 5 connected by means of a valve 6 to a carrier gas source 7 issues into the bottom of enclosure 1. The carrier gas introduced by pipe 5 can be charged with vapour or the organometallic compound by bubbling into the compound in the liquid state, followed by discharge from the enclosure by a pipe 9 provided with a valve 10. The gaseous stream is then introduced into the epitaxy reactor by pipe 11 after diluting it to the desired value by adding carrier gas supplied by pipe 13, equipped with the valve 14 connected to the carrier gas source 7.

When using an apparatus of this type, the partial pressure of the organometallic compound in the carrier gas leaving by pipe 11 is dependent on the following physical parameters:

(1) the temperature of the source of the organometallic compound in enclosure 1;
(2) the flowrate of the carrier gas bubbling into the organometallic compound source;
(3) the gaseous phase pressure above the organometallic compound source in the enclosure 1;
(4) the liquid level in enclosure 1;
(5) the total flowrate and the pressure of the gas in the epitaxy reactor.

Among these different parameters, only the total flowrate and pressure of the gas in the epitaxy reactor acts simultaneously and in the same way on all partial pressures of the organometallic compounds introduced into said reactor. Thus, they are not likely to modify the solid phase composition, which is solely a function of the ratios between the different partial pressures. However, the first four parameters act independently on each partial pressure and for accurately checking the composition of the solid phase alloys, it is necessary to accurately control each temperature, each carrier gas flowrate and each gas pressure in contact with the sources of organometallic compounds.

In order to check the gaseous flowrates, use is generally made of a mass regulating flowmeter, which is a flowrate transducer based on the heat transfer measurement in the gas, coupled via an electronic regulating circuit to a variable opening valve.

Although such equipment represents a considerable advance compared with older procedures, such as ball flowmeters, they suffer from the following disadvantages. They are sensitive to the temperature of the gases and to ambient temperature, typically 0.1% of the full scale per °C. Therefore variations of only a few degrees can compromise the quality of an epitaxy operation by modifying the composition of an alloy by a fraction of a percent. They have a high cost and only mediocre reliability due to their complexity. They have relatively long response times (a few seconds), so that it is difficult to ensure that the epitaxy process is controlled in transient operating conditions, e.g. the interface between two layers of different compositions.

The use of an apparatus of this type also suffers from other disadvantages. Thus, the carrier gas on leaving enclosure 1 is almost charged with organometallic compound, so that during its passage through a duct at a temperature below that of the organometallic compound source, organometallic compound can be deposited. To avoid and minimise this highly disadvantageous effect, the ducts are generally heated and, as soon as possible, the carrier gas is diluted, which makes the equipment much more complicated and inter alia leads to a doubling in the number of flowmeters.

Furthermore, this apparatus cannot be used for all organometallic compounds, because it is necessary for the combination of the physical properties of the organometallic compound, in particular its melting point and vapour pressure to be suitable for putting into effect this procedure for evaporating and introducing into a gaseous stream.

Thus, certain compounds can have an excessively high vapour pressure or tension at temperatures close to ambient temperature, which involves cooling them to lower temperatures. Other compounds can have a suitable vapour pressure, but can be in the solid state at temperatures close to ambient temperature.

Although it is possible to saturate a carrier gas by circulating it above a solid which sublimates, said process in practice leads to less reproduceable results than those supplied by bubbling gas into a liquid source. In addition, it is necessary to very carefully select the compounds to be introduced by this procedure into the epitaxy reactor.

SUMMARY OF THE INVENTION

The present invention specifically relates to a process and to an apparatus for obtaining a gaseous stream containing a compound in the vapour state making it possible to eliminate the disadvantages referred to hereinbefore and obtain a better accuracy and reproduceability for the introduction of gaseous compounds into an epitaxy reactor.

Thus, the present invention specifically relates to a process for obtaining a gaseous stream containing a compound in the vapour state, wherein it comprises:

(a) introducing the compound into the first compartment of an enclosure subdivided into a first and a second compartments by a porous partition, (b) raising the first compartment of the enclosure to a predetermined temperature in order to evaporate said compound, (c) circulating in the second compartment a carrier gas able to entrain the evaporated compound, and (d) extracting from the second compartment the carrier gas containing the evaporated compound, which has diffused into the second compartment by passing through the porous partition.

Preferably, according to the invention, the compound is brought into the liquid state in the vicinity of the porous partition, so that the compound is particularly evaporated in the vicinity of said partition.

According to this process, the partial pressure of the compound in the vapour state in the carrier gas leaving the second compartment is regulated to the desired value by acting on the temperature to which the first compartment is raised and on the carrier gas flowrate circulated in the second compartment.

Thus, the flowrate of the evaporated compound diffusing into the second compartment is solely a function of fixed parameters, which are characteristics of the equipment, which are the porosity, thickness and cross-section of the porous partition, and on the temperature acting both on the vapour pressure of the compound and on the diffusion coefficient of the vapour of the compound in the carrier gas.

Thus, for a given apparatus, the temperature is the sole parameter permitting a precise adjustment of the flow of compound diffused through the porous partition. Once this flow has been fixed by the choice of temperature, it is possible to adjust the partial pressure of the compound in the vapour state in the carrier gas to the desired value by appropriately regulating the flowrate of the carrier gas circulated in the second compartment.

Thus, the process according to the invention has numerous advantages:

1. The flowrate of the compound diffused in the vapour state is independent of the flowrate of the vector gas from the time where the latter is adequate for entraining the vapour which has diffused through the partition, so that the use of accurate, costly flowmeters is superfluous. 2. This independence between two flowrates makes it possible to choose a vector gas flow ensuring an adequate dilution for preventing any condensation on the cold parts located downstream and thus dispenses with the heating of ducts.

3. As evaporation takes place in the vicinity of the porous partition, the diffused flow is independent of the filling level of the first compartment.

4. The temperature to which the first compartment is raised can exceed that used with the prior art apparatus, because it is possible to choose characteristics of the equipment such as the cross-section, porosity and thickness of the porous partition, so as to obtain a desired diffusion flow of vapour of the compound, even when the vapour pressure thereof is high at ambient temperature.

5. Pressure fluctuations appearing with the prior art apparatus due to the bubbling of the carrier gas into the liquid compound source are prevented.

According to the invention, it is also possible to regulate the vapour diffusion flow of the compound by appropriately choosing the carrier gas used. Thus, the flowrate varies as a function of the carrier gas used and this can e.g. be argon, nitrogen, hydrogen or helium. Thus, under the same temperature conditions and with the same equipment, the diffused flow is 3 or 4 times higher when using hydrogen instead of argon as the carrier gas.

The process according to the invention consequently makes it possible to more easily regulate to the desired value the partial pressure of a gaseous compound introduced into an epitaxy reactor and it also makes it possible to obtain a better accuracy and reproduceability. Moreover, the equipment used has a lower cost and this process can be applied to a wider range of compounds.

The present invention also relates to an apparatus for obtaining a gaseous stream containing a compound in the vapour state, wherein it comprises a tight enclosure subdivided into first and second compartments by a porous partition, the first compartment being able to contain said compound, means for bringing about the circulation in the second compartment of a vector gas able to entrain the compound in the vapour state, which has diffused through the porous wall from the first compartment into the second compartment and means for raising and maintaining the first compartment at a given temperature.

Preferably, the first compartment also comprises means for bringing the compound in the liquid state into the vicinity of the porous partition.

For example, said means can be constituted by a porous element which can be charged by capillarity with the compound in the liquid state. Preferably, the porous element is made from the same material as the porous partition, e.g. silica, stainless steel or borosilicate glass.

It is possible to use any other material compatible with the compound and the carrier gas. It is also possible to make the enclosure from a non-porous material of the same type.

A material whose porosity characteristics make it possible to establish pure diffusion operating conditions is chosen for the partition and the porous element.

According to the invention, the geometrical characteristics of the porous partition, i.e. its cross-section and thickness, as well as its porosity characteristics are also chosen as a function of the compound.

When the compound is an organometallic compound, such as trimethyl-indium or trimethyl-gallium, it is possible to use a porous partition made from powder glass, such as glass of the type marketed under the trademark Pyrex with porosities of 1 to 5.

According to the invention, the means for circulating the carrier gas in the second compartment advantageously comprise a first pipe for introducing a carrier gas and a second pipe for extracting said carrier gas containing the compound in the vapour state, the second pipe issuing into the second compartment in the vicinity of the porous partition.

The apparatus according to the invention can in particular be used in a vapour phase epitaxy apparatus comprising an epitaxy reactor for introducing into the latter at least one of the reagents in the gaseous state, e.g. organometallic compounds, such as trimethyl-indium and trimethyl-gallium.

BRIEF DESCRIPTION OF THE DRAWINGS

The invention is described in greater detail hereinafter relative to non-limitative embodiments and the attached drawings, wherein show:

FIG. 1, already described, a prior art apparatus.

FIG. 2 in vertical section an apparatus according to the invention.

DETAILED DESCRIPTION OF THE PREFERRED EMBODIMENTS

FIG. 2 shows the apparatus according to the invention comprising a tight enclosure 21 subdivided into two compartments 21a, 21b by a porous partition 23. The first compartment 21a receives the compound to be evaporated and to be introduced into the gaseous stream and it is equipped with a porous element 25, which can be charged by capillarity with the compound in the liquid state located in compartment 21a, so as to bring said compound into the liquid state in the vicinity of the porous partition 23. The second compartment is connected by a first pipe 27 for introducing the gas and which is equipped with a valve 29 to a not shown carrier gas source, and the carrier gas can be extracted from the second compartment by a second extraction pipe 31, equipped with a valve 33 issuing into compartment 21b in the vicinity of porous partition 23. The apparatus also comprises a thermostatically controlled bath 35 making it possible to maintain the first compartment 21a at the desired temperature. As shown by the broken lines in FIG. 2, it is also possible to maintain the two compartments of enclosure 21 at the same temperature by circulating around the same a liquid thermostatically controlled by pipes 37 and 39.

The apparatus functions in the following way. The compound to be evaporated is firstly introduced into the first compartment 21a, which can be carried out directly by filling when compartment 21a has a side opening, which can then be tightly closed. It is also possible to carry out this filling by vacuum distillation through valve 29 by cooling the two compartments of enclosure 21 and by transferring in the liquid state and under vacuum, the compound from compartment 21b to compartment 21a. Following this filling phase, the first compartment is raised to the desired temperature and the carrier gas is circulated in compartment 21b by opening valves 29, 33 and regulating valve 29 to the desired flowrate.

Under these conditions, the compound supplied by element 25 at porous partition 23 evaporates at the latter and then diffuses through partition 23 into compartment 21b, where it is entrained by the carrier gas circulated therein and is evacuated from said compartment by pipe 31.

In such an apparatus, the flowrate of the evaporated compound which diffuses through partition 23 is solely dependent on the temperature acting both on the vapour pressure of the compound and on the diffusion coefficient thereof in the carrier gas. This flowrate increases with the temperature, proportionally to the product of the vapour pressure of the compound by the diffusion coefficient of said vapour in the carrier gas.

The partial pressure of the compound in the carrier gas leaving by pipe 31 varies with the flowrate of the carrier gas circulated in compartment 21b. In general, a carrier gas flowrate is chosen, which ensures an adequate dilution of the compound to prevent any condensation on the cold parts of the apparatus located downstream, thereby preventing the heating of the ducts.

The following examples are given in a non-limitative manner for illustrating the invention.

In these examples, use is made of a porous partition 23 constituted by a disk having a diameter of 13 mm and a thickness of 4 mm made from powder glass marketed under the name Pyrex 1, which signifies that the equivalent pore diameter corresponding to the diameter of a channel having a circular section equivalent to the largest pore is 101 to 160 $\mu$m. Element 25 is also made from Pyrex 1 powder glass.

In a first example, a trimethyl-indium-charged argon stream was obtained by operating at a temperature of 90.5° C. with an argon flowrate in the second compartment 21b of 100 ml/min. Under these conditions, on leaving the apparatus a trimethyl-indium flowrate of 0.9 mmol/h was obtained.

In a second example, a trimethyl-gallium-containing argon gaseous stream was obtained by operating at a temperature of 18° C. with an argon flowrate of 100 ml/min. Under these conditions, the trimethyl-gallium flowrate leaving the apparatus was 0.94 mmol/h.

What is claimed is:

1. A process for providing a gaseous stream containing a compound in the vapour state, comprising the steps of:
    (a) introducing a compound to be provided in the vapour state in a gaseous stream into a first compartment of an enclosure which is separated from a second compartment by a porous partition and containing said compound in said first compartment to prevent passage of compound except in its vapour state through said porous partition.

(b) heating said compound in said first compartment to a predetermined temperature to provide compound in the vapour state and diffusing the compound in the vapour state in said first compartment through said porous portion into said second compartment, (c) circulating in the second compartment a carrier gas able to entrain the compound in the vapour state, and (d) extracting from the second compartment the carrier gas containing diffused compound in the vapour state to provide said gaseous stream.

2. A process according to claim 1, wherein, the carrier gas is selected from the group consisting of argon, nitrogen, hydrogen and helium.

3. A process according to claim 1, wherein, the compound is an organometallic compound.

4. A process according to claim 3, wherein the organometallic compound is selected from the group consisting of trimethyl-gallium and trimethyl-indium.

5. An apparatus for providing a gaseous stream containing a compound in the vapour state comprising an enclosure subdivided into first and second compartments by a porous partition, the first compartment being adapted to contain said compound in the liquid state remote from said porous partition and to prevent passage of said compound except in the vapour state through said porous partition, a porous element adapted to be charged by capillarity with said compound in the liquid state in said first compartment and to deliver said compound in the liquid state to a location in said first compartment spaced from said porous partition, means for heating said compound to convert it from the liquid state to the vapour state within said first compartment for diffusion of said compound in the vapour state through said porous partition into said second compartment, and means for circulating in the second compartment a carrier gas able to entrain the diffused compound in the vapour state to provide said gaseous stream.

6. An apparatus according to claim 5, wherein, the porous element is made from the same material as the porous partition.

7. An apparatus according to either of the claims 5 and 6, wherein, the porous partition is made of a material selected from the group consisting of silica, stainless steel and borosilicate glass.

8. An apparatus according to either of the claims 5 and 6, wherein, said heating means comprise compartment heating means for heating each of said compartments to a predetermined temperature and maintaining each of said compartments at said predetermined temperature.

9. An apparatus according to claim 5, wherein, the means for circulating the carrier gas in the second compartment comprise a first pipe for introducing the carrier gas and a second pipe for extracting the carrier gas containing compound in the vapour state, the second pipe having an inlet opening in the second compartment adjacent the porous partition.

10. A vapour phase epitaxy apparatus comprising an epitaxy reactor and means for introducing into the latter reagents in the gaseous state, wherein, the means for introducing at least one of said reagents in the gaseous state into the epitaxy reactor are constituted by an apparatus according to any one of the claims 5, 6 and 8.

* * * * *